United States Patent
Mattis et al.

(10) Patent No.: US 11,150,409 B2
(45) Date of Patent: Oct. 19, 2021

(54) SAW ASSISTED FACET ETCH DICING

(71) Applicant: GenXComm, Inc, Austin, TX (US)

(72) Inventors: Brian Mattis, Austin, TX (US); Taran Huffman, Austin, TX (US); Jason Andrach, Santa Barbara, CA (US); Hussein Nili, Goleta, CA (US); George Palmer, Aptos, CA (US)

(73) Assignee: GenXComm, Inc., Austin, TX (US)

( * ) Notice: Subject to any disclaimer, the term of this patent is extended or adjusted under 35 U.S.C. 154(b) by 31 days.

(21) Appl. No.: 16/406,541

(22) Filed: May 8, 2019

(65) Prior Publication Data
US 2020/0209476 A1 Jul. 2, 2020

Related U.S. Application Data

(60) Provisional application No. 62/785,546, filed on Dec. 27, 2018.

(51) Int. Cl.
*H01L 23/00* (2006.01)
*G02B 6/136* (2006.01)
(Continued)

(52) U.S. Cl.
CPC ........ *G02B 6/136* (2013.01); *H01L 21/02076* (2013.01); *H01L 21/308* (2013.01);
(Continued)

(58) Field of Classification Search
None
See application file for complete search history.

(56) References Cited

U.S. PATENT DOCUMENTS

| 4,608,569 A | 8/1986 | Dickey, Jr. et al. |
| 5,444,864 A | 8/1995 | Smith |
(Continued)

FOREIGN PATENT DOCUMENTS

| CN | 101379718 | 3/2009 |
| CN | 104484852 | 4/2015 |
(Continued)

OTHER PUBLICATIONS

Chang et al., "Full-duplex spectrum sensing in cognitive radios using optical self-interference cancellation," 2015 9th International Conference on Sensing Technology (ICST), IEEE, Dec. 8, 2015, pp. 341-344.
(Continued)

*Primary Examiner* — Ali Naraghi
(74) *Attorney, Agent, or Firm* — Brownstein Hyatt Farber Schreck, LLP

(57) ABSTRACT

A dicing system and methods may include a novel way to separate die on a wafer in preparation for packaging that results in smooth diced edges. This is specifically advantageous, but not limited to, edge-coupled photonic chips. This method etches from the front side of the wafer and dices from the back side of the wafer to create a complete separation of die. It creates an optically smooth surface on the front side of the wafer at the location of the optical device (waveguides or other) which enables direct mounting of adjacent devices with low coupling loss and low optical scattering. The backside dicing may be wider than the front side etch, so as to recess this sawed surface and prevent it from protruding outward, resulting in rough surfaces inhibiting a direct joining of adjacent devices.

20 Claims, 9 Drawing Sheets

300

(51) Int. Cl.
  *H01L 21/02* (2006.01)
  *H01L 21/3065* (2006.01)
  *H01L 21/683* (2006.01)
  *H01L 21/78* (2006.01)
  *H01L 21/308* (2006.01)
  *G02B 6/12* (2006.01)

(52) U.S. Cl.
  CPC ...... *H01L 21/3065* (2013.01); *H01L 21/6836* (2013.01); *H01L 21/78* (2013.01); *G02B 2006/12173* (2013.01); *H01L 2221/68327* (2013.01)

(56) References Cited

U.S. PATENT DOCUMENTS

| | | |
|---|---|---|
| 5,699,176 A | 12/1997 | Cohen |
| RE35,736 E | 2/1998 | Powell |
| 5,757,312 A | 5/1998 | Szmurlo |
| 5,867,293 A | 2/1999 | Kotten |
| 5,904,546 A | 5/1999 | Wood et al. |
| 6,359,714 B1 | 3/2002 | Imajo |
| 6,373,909 B2 | 4/2002 | Lindquist |
| 6,507,728 B1 | 1/2003 | Watanabe |
| 6,539,204 B1 | 3/2003 | Marsh |
| 6,567,648 B1 | 5/2003 | Ahn |
| 6,567,649 B2 | 5/2003 | Souissi |
| 6,745,018 B1 | 6/2004 | Zehavi |
| 6,751,447 B1 | 6/2004 | Jin |
| 6,760,454 B1 | 7/2004 | Shreve |
| 6,771,931 B2 | 8/2004 | Waltho |
| 6,778,319 B2 | 8/2004 | Chavez-Pirson |
| 6,907,093 B2 | 6/2005 | Blount |
| 7,020,396 B2 | 3/2006 | Izadpanah |
| 7,058,368 B2 | 6/2006 | Nicholls |
| 7,064,697 B2 | 6/2006 | Taylor et al. |
| 7,085,497 B2 | 8/2006 | Tiemann |
| 7,123,676 B2 | 10/2006 | Gebara |
| 7,130,289 B2 | 10/2006 | Kuan et al. |
| 7,355,993 B2 | 4/2008 | Adkins |
| 7,366,244 B2 | 4/2008 | Gebara |
| 7,446,601 B2 | 11/2008 | LeChevalier |
| 7,496,257 B2 | 2/2009 | Levner |
| 7,509,054 B2 | 3/2009 | Calabro et al. |
| 7,566,634 B2 | 7/2009 | Beyne et al. |
| 7,650,080 B2 | 1/2010 | Yap |
| 7,660,531 B2 | 2/2010 | Lee |
| 7,672,643 B2 | 3/2010 | Loh |
| 7,680,368 B2 | 3/2010 | Welch et al. |
| 7,711,329 B2 | 5/2010 | Aparin |
| 7,720,029 B2 | 5/2010 | Orava |
| 7,729,431 B2 | 6/2010 | Gebara |
| 7,756,480 B2 | 7/2010 | Loh |
| 7,809,047 B2 | 10/2010 | Kummetz |
| 7,826,808 B2 | 11/2010 | Faulkner |
| 7,853,195 B2 | 12/2010 | Higgins |
| 7,869,527 B2 | 1/2011 | Vetter |
| 7,876,867 B2 | 1/2011 | Filipovic |
| 7,907,895 B2 | 3/2011 | Shinagawa |
| 7,917,177 B2 | 3/2011 | Bauman |
| 8,036,606 B2 | 10/2011 | Kenington |
| 8,055,235 B1 | 11/2011 | Gupta et al. |
| 8,078,130 B2 | 12/2011 | Fudge |
| 8,081,946 B2 | 12/2011 | Fudge |
| 8,155,605 B2 | 4/2012 | Hwang |
| 8,170,487 B2 | 5/2012 | Sahota et al. |
| 8,233,872 B2 | 7/2012 | Nagai |
| 8,249,540 B1 | 8/2012 | Gupta |
| 8,270,843 B2 | 9/2012 | Nakamoto |
| 8,299,555 B2 | 10/2012 | Su et al. |
| 8,320,504 B2 | 11/2012 | Peng |
| 8,331,509 B2 | 12/2012 | Wang |
| 8,351,874 B2 | 1/2013 | Dent |
| 8,477,871 B2 | 7/2013 | Neumann |
| 8,521,090 B2 | 8/2013 | Kim |
| 8,526,903 B2 | 9/2013 | Gudem |
| 8,565,681 B2 | 10/2013 | Kim |
| 8,600,200 B1 | 12/2013 | Rakich et al. |
| 8,618,966 B2 | 12/2013 | Kanter |
| 8,682,170 B2 | 3/2014 | Prucnal |
| 8,730,786 B2 | 5/2014 | Wang |
| 8,781,030 B2 | 7/2014 | Peng |
| 8,785,332 B2 | 7/2014 | Johnson et al. |
| 8,805,298 B2 | 8/2014 | McCallister |
| 8,845,854 B2 | 9/2014 | Lei et al. |
| 8,867,928 B2 | 10/2014 | Piehler |
| 8,872,583 B2 | 10/2014 | Lee |
| 8,971,712 B2 | 3/2015 | Fan et al. |
| 8,977,223 B1 | 3/2015 | Gupta |
| 9,020,307 B2 | 4/2015 | Ishikawa |
| 9,100,099 B2 | 8/2015 | Loh |
| 9,106,453 B2 | 8/2015 | Wang |
| 9,178,635 B2 | 11/2015 | Ben-Shlomo |
| 9,184,902 B2 | 11/2015 | Khojastepour |
| 9,195,052 B2 | 11/2015 | Long |
| 9,214,718 B2 | 12/2015 | Mow |
| 9,224,650 B2 | 12/2015 | Lei et al. |
| 9,252,857 B2 | 2/2016 | Negus |
| 9,253,003 B1 | 2/2016 | Harel |
| 9,257,811 B2 | 2/2016 | Gao |
| 9,258,052 B2 | 2/2016 | George |
| 9,268,092 B1 | 2/2016 | Jarecki, Jr. |
| 9,344,125 B2 | 5/2016 | Kpodzo |
| 9,344,139 B2 | 5/2016 | Sjoland |
| 9,385,268 B2 | 7/2016 | Minamiru et al. |
| 9,391,667 B2 | 7/2016 | Sundstrom |
| 9,438,288 B2 | 9/2016 | Feld |
| 9,450,623 B2 | 9/2016 | Weissman |
| 9,490,963 B2 | 11/2016 | Choi |
| 9,520,985 B2 | 12/2016 | Choi |
| 9,571,205 B1 | 2/2017 | Suarez |
| 9,589,812 B2 | 3/2017 | Takahashi et al. |
| 9,602,149 B1 | 3/2017 | Tanzi |
| 9,608,718 B2 | 3/2017 | Monsen |
| 9,651,652 B2 | 5/2017 | Kpodzo et al. |
| 9,667,404 B2 | 5/2017 | Sjoland |
| 9,696,492 B1 | 7/2017 | Cox |
| 9,698,913 B2 | 7/2017 | Foster |
| 9,712,233 B1 | 7/2017 | Deng |
| 9,722,713 B2 | 8/2017 | Tanzi |
| 9,723,612 B2 | 8/2017 | Stapleton |
| 9,726,821 B2 | 8/2017 | Murray et al. |
| 9,748,906 B2 | 8/2017 | Stewart |
| 9,768,852 B2 | 9/2017 | Ling |
| 9,774,364 B2 | 9/2017 | Shih |
| 9,775,123 B2 | 9/2017 | Harel |
| 9,793,943 B2 | 10/2017 | Sjoland |
| 9,793,992 B2 | 10/2017 | Hino |
| 9,807,700 B2 | 10/2017 | Harel |
| 9,847,258 B2 | 12/2017 | Rohleder et al. |
| 9,871,552 B2 | 1/2018 | Din |
| 9,885,806 B2 | 2/2018 | Steinhardt |
| 9,885,825 B2 | 2/2018 | Kopp |
| 9,900,044 B2 | 2/2018 | Sjoland |
| 9,923,593 B2 | 3/2018 | Andersson |
| 9,923,708 B2 | 3/2018 | Khandani |
| 9,960,805 B2 | 5/2018 | Wyville |
| 9,960,850 B2 | 5/2018 | Daniel |
| 9,973,282 B2 | 5/2018 | Welch |
| 9,997,363 B2 | 6/2018 | Ono et al. |
| 10,009,120 B2 | 6/2018 | Ranson |
| 10,027,465 B2 | 7/2018 | Sjoland |
| 10,031,246 B2 | 7/2018 | Zhou |
| 10,038,471 B2 | 7/2018 | Chang |
| 10,084,506 B2 | 9/2018 | Sjoland |
| 10,110,306 B2 | 10/2018 | Jain et al. |
| 10,177,836 B2 | 1/2019 | Hong |
| 10,187,158 B2 | 1/2019 | Kikuchi |
| 10,257,746 B2 | 4/2019 | Jain et al. |
| 10,321,357 B1 | 6/2019 | Jain et al. |
| 10,325,861 B2 | 6/2019 | Miccoli |
| 10,341,028 B2 | 7/2019 | Kanter |
| 10,356,782 B2 | 7/2019 | Negus |
| 10,367,584 B2 | 7/2019 | Rakich |

(56) References Cited

U.S. PATENT DOCUMENTS

| | | | |
|---|---|---|---|
| 10,418,775 B2 | 9/2019 | Gao | |
| 10,491,313 B2 | 11/2019 | Jain | |
| 10,656,350 B2 | 5/2020 | Chen et al. | |
| 10,663,663 B2 | 5/2020 | Painchaud | |
| 10,673,519 B2 | 6/2020 | Hong | |
| 10,727,945 B1 | 7/2020 | Nguyen et al. | |
| 10,754,091 B1 | 8/2020 | Nagarajan | |
| 10,873,877 B2 | 12/2020 | Jain et al. | |
| 2003/0161637 A1 | 8/2003 | Yamamoto | |
| 2004/0151238 A1 | 8/2004 | Masenten | |
| 2004/0264610 A1 | 12/2004 | Marro | |
| 2006/0068567 A1* | 3/2006 | Beyne | H01L 21/78 438/460 |
| 2011/0065408 A1 | 3/2011 | Kenington | |
| 2011/0065409 A1 | 3/2011 | Kenington | |
| 2013/0295980 A1 | 11/2013 | Reuven | |
| 2014/0169236 A1 | 6/2014 | Choi | |
| 2015/0205041 A1* | 7/2015 | Neelakantan | G02B 6/428 385/14 |
| 2016/0056080 A1* | 2/2016 | Takahashi | H01L 21/6836 438/462 |
| 2016/0103341 A1 | 4/2016 | Long | |
| 2016/0133784 A1* | 5/2016 | Minamiru | H01L 33/0095 438/33 |
| 2018/0006795 A1 | 1/2018 | Raaf | |
| 2018/0096952 A1* | 4/2018 | Miccoli | H01L 21/31111 |
| 2018/0248627 A1 | 8/2018 | Daniel | |
| 2019/0007140 A1 | 1/2019 | Vishwanath et al. | |
| 2020/0209476 A1 | 7/2020 | Mattis et al. | |
| 2020/0229031 A1 | 7/2020 | Jain et al. | |
| 2021/0036779 A1 | 2/2021 | Nguyen et al. | |

FOREIGN PATENT DOCUMENTS

| | | |
|---|---|---|
| EP | 3561561 | 10/2019 |
| GB | 2139374 | 11/1984 |
| JP | 2002214461 | 7/2002 |
| JP | 2006301415 | 11/2006 |
| RU | 2474056 | 1/2013 |
| WO | WO 06/072086 | 7/2006 |
| WO | WO 07/092767 | 8/2007 |
| WO | WO 08/036356 | 3/2008 |
| WO | WO 12/112357 | 8/2012 |

OTHER PUBLICATIONS

IBM, "Silicon Nanophotonic Packaging," https://researcher.watson.ibm.com/researcher/view_group_subpage.php?id=5522, Jul. 2016.

Li et al., "Multimode silicon photonics," Nanophotonics, vol. 8, No. 2, May 16, 2019, pp. 2270247.

Velha et al., "Simultaneous data transmissions on engineered closely packed silicon-on-insulator waveguide arrays," 19th International Conference on Transparent Optical Networks (ICTON), IEEE, Jul. 2, 2017, pp. 1-4.

Tang et al., "System limitations due to channel cross-coupling in a highly parallel polymer-based single-mode channel waveguide array," Advances in Resistive Technology and Processing XVI, vol. 2042, Aug. 16, 1993, 12 pages.

Yoo et al., "Heterogeneous 2D/3D photonic integrated microsystems," Microsystems & Nanoengineering, 2016, 2, 16030, Aug. 2016.

* cited by examiner

SAW ASSISTED FACET ETCH DICING

RELATED APPLICATIONS

The present application claims the benefit of U.S. Provisional Patent Application Ser. No. 62/785,546 filed on Dec. 27, 2018 is hereby expressly incorporated by reference in its entirety.

FIELD OF THE INVENTION

The disclosure relates generally to photonic die and systems, dicing and packaging apparatus and methods for separating a die on wafer in preparation for packaging. The disclosure also relates to methods for manufacturing photonic systems and apparatus. More particularly, the present invention is in the technical field of manufacturing edge coupled photonic devices for packaging or coupling to other devices.

BACKGROUND OF THE INVENTION

Manufacturing of dies on silicon wafers include dicing of the wafers to separate the dies on the wafer in preparation for packaging of such dies. The process of dicing the wafers into individual dies using mechanical dicing blades results in the separated dies with rough edges. Photonic systems with edge coupling require much smother surfaces for direct connect of waveguides or optical cables to die due to inherent losses of signal associated with rough connected edges.

Traditional means of creating smooth die surface involve time intensive and costly manual polishing of dies. Other means available for dicing such as plasma dicing, laser dicing, or stealth dicing either are time intensive, require specialized tooling, or have other adverse effects on wafers.

For reasons stated above and for other reasons which will become apparent to those skilled in the art upon reading and understanding the present specification, there is a need in the art for improved systems and methods for separating dies with smooth edges on a wafer for uses requiring such smooth edges such as for use in photonic chips and other edge connected devices requiring direct connection of waveguides and optical fibers, and for improved methods of manufacturing the same.

BRIEF DESCRIPTION OF THE INVENTION

The above-mentioned shortcomings, disadvantages and problems are addressed herein, as will be understood by those skilled in the art upon reading and studying the following specification.

This Summary is provided to introduce a selection of concepts in a simplified form that are further described below in more detail in the Detailed Description. This Summary is not intended to identify key or essential features of the claimed subject matter.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Direct attachment of fiber optic cable, laser die, photodetector die, or any other edge connection to a photonic integrated chip requires saw dicing followed by facet polishing to reach a smoothness to avoid light scattering.

In one aspect, systems, apparatus, and methods are provided through which the above objective of dicing of dies on wafers may be accomplished by using dry-etched facet without the cost and tooling of plasma dicing, enabling a cost-effective way to prepare edge-coupled photonic devices for packaging or coupling to other devices.

In one aspect, systems, apparatus and methods are provided through which ideal surface roughness may be achieved by providing an etched surface at the location (depth) of the waveguide, giving an ideal surface roughness beyond that of saw dicing, polishing, or laser dicing. This reduces scattering loss of the integrated waveguide at the surface, decreasing the coupling loss to externally coupled devices. This low roughness is achieved through dry etching in a cleanroom environment.

SAFE dicing may also use a backside dicing saw to improve cost and throughput. The backside sawing mechanism causes a lateral recess relative to the etched facet. This is ideal and grants direct access for other coupled devices of any thickness to the dry-etched facet waveguide(s).

Plasma Dicing refers to dry etching through the entire wafer in a cleanroom environment to achieve a high-quality facet. However, it is relatively a long and expensive process that requires special tooling and is not suitable for large die sizes. By use of the disclosed invention, a cleanroom die etch is only needed to traverse through the waveguide and partway into the substrate. This enables the use of standard cleanroom equipment and reduces tool time and associated cost. The backside saw completes the dicing, a process which is more cost effective, efficient and the resulting roughness at the diced edge is of no consequence to the dry-etched waveguide surface which is not affected by the dicing saw.

Apparatus, systems, and methods of varying scope are described herein. These aspects are indicative of various non-limiting ways in which the disclosed subject matter may be utilized, all of which are intended to be within the scope of the disclosed subject matter. In addition to the aspects and advantages described in this summary, further aspects, features, and advantages will become apparent by reference to the associated drawings, detailed description, and claims.

BRIEF DESCRIPTION OF THE DRAWINGS

The disclosed subject matter itself, as well as further objectives, and advantages thereof, will best be illustrated by reference to the following detailed description of embodiments of the methods and systems read in conjunction with the accompanying drawings, wherein.

DETAILED DESCRIPTION OF THE INVENTION

Figure 1:
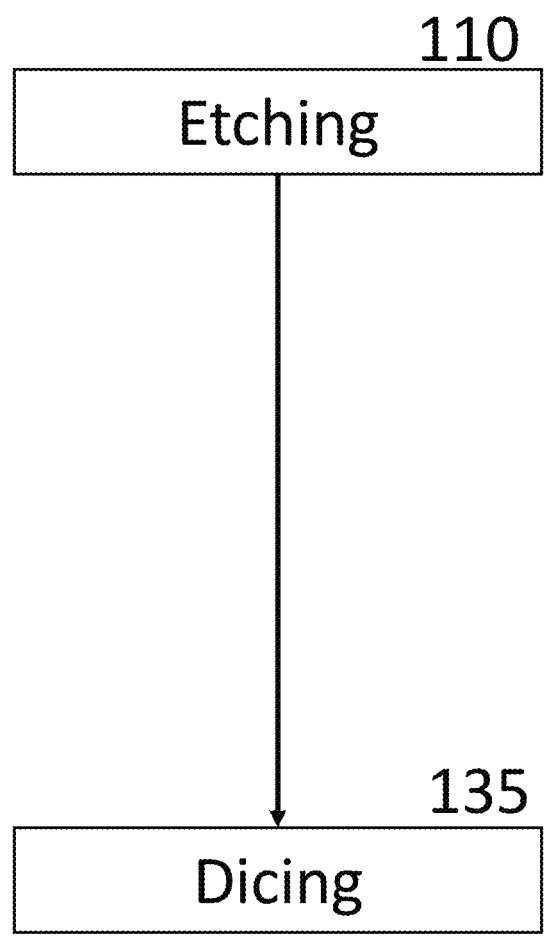
FIG. 1 illustrates, in flowchart form, the method 100 by using etching 110 in combination with dicing 135 according to some embodiments.

In the following detailed description, reference is made to the accompanying drawings which form a part hereof, and in which is shown by way of illustration specific embodiments which may be practiced. These embodiments are described in sufficient detail to enable those skilled in the art to practice the embodiments and disclosure. It is to be understood that other embodiments may be utilized, and that logical, mechanical, electrical, and other changes may be made without departing from the scope of the embodiments and disclosure. In view of the foregoing, the following detailed description is not to be taken as limiting the scope of the embodiments or disclosure.

The terminology used herein is for the purpose of describing particular embodiments only and is not intended to be limiting. As used herein, the singular forms "a", "an", and "the" are intended to include the plural forms as well, unless the context clearly indicates otherwise. It will be further understood that the terms "comprises" and/or "comprising" or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be appreciated that for simplicity and clarity of illustration, where considered appropriate, reference numerals may be repeated among the figures to indicate corresponding or analogous elements. In addition, numerous specific details are set forth in order to provide a thorough understanding of the implementations described herein. However, it will be understood by those of ordinary skill in the art that the implementations described herein may be practiced without these specific details. In other instances, well-known methods, procedures and components have not been described in detail so as not to obscure the implementations described herein. Also, the description is not to be considered as limiting the scope of the implementations described herein.

The detailed description set forth herein in connection with the appended drawings is intended as a description of exemplary embodiments in which the presently disclosed apparatus and system can be practiced. The term "exemplary" used throughout this description means "serving as an example, instance, or illustration," and should not necessarily be construed as preferred or advantageous over other embodiments.

Illustrated in FIG. 1 is a simplified flowchart of an exemplary dicing method 100 to make a die having a smooth edge according to an embodiment that comprises the two steps of etching 110 the frontside of a wafer through active layers of the wafer to create an etched cavity extending through the active layers into a substrate of the die and dicing 135 the wafer from backside of the wafer to at least the bottom surface of the etched cavity to create a diced cavity or accomplish the separation of the dies on the wafer.

Dicing the wafer from the backside of the wafer accomplishes the objective of getting a smooth edge on the die in the active layers as the dicing blade does not go through the active layers and the resulting rough edges associated with the dicing blade may be avoided in the layers of interest.

In other embodiments, the depth of the etched cavity may not go all the way through all the active layers on the wafer if the relevant layers that require the desired smoothness happen to be only a few of the top active layers but not all active layers.

The etching 110 step in combination with dicing 135 the remaining wafer from the backside to a thickness less than the whole wafer thickness may produce dies that are useful for any photonic system looking to edge-couple to other integrated waveguides.

Figure 2:
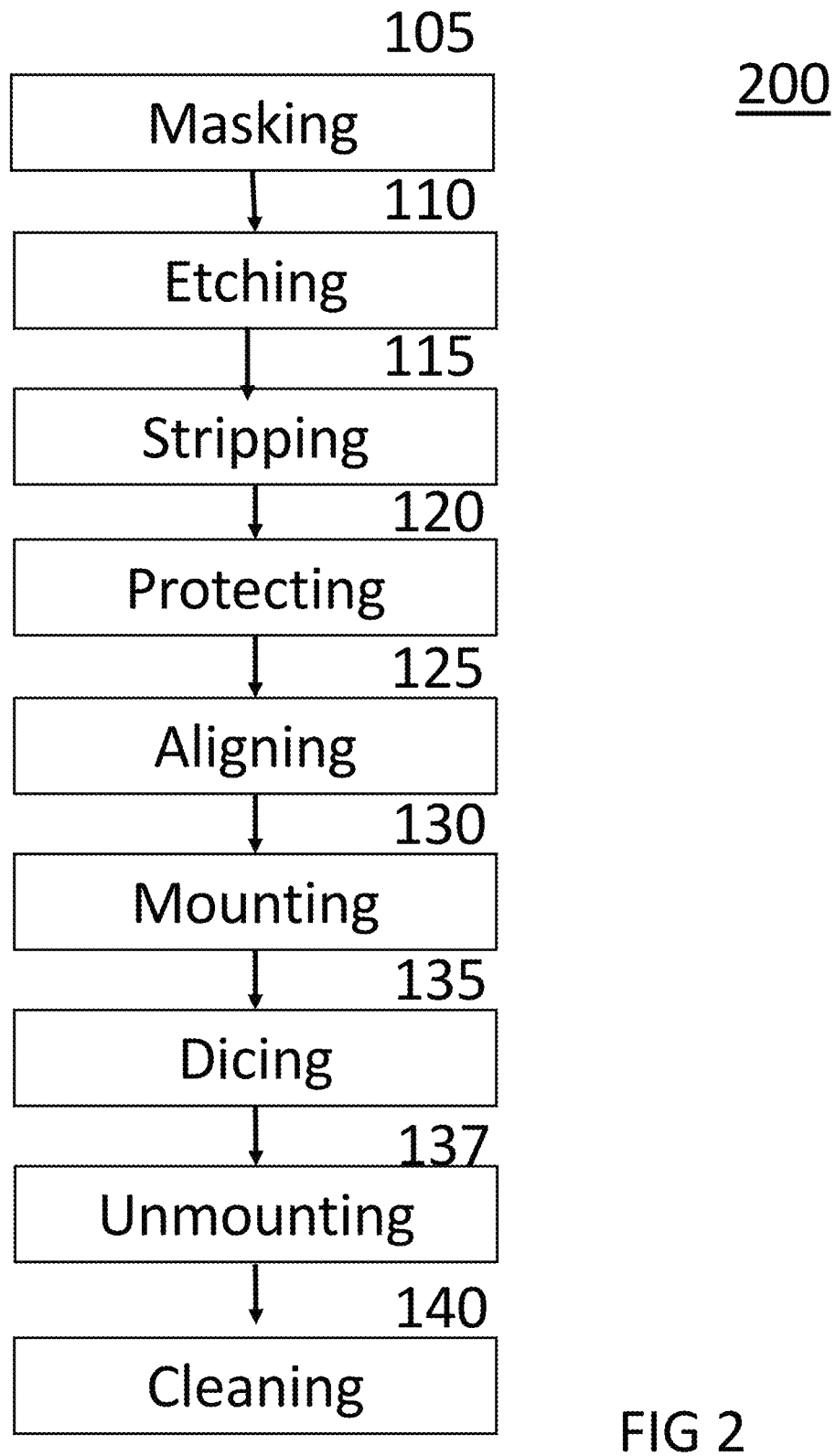
FIG. 2 is a simplified flowchart of a dicing method 200 according to an embodiment.

In the discussion that follows describes a set of steps that may be used to separate dies with smooth edges that may be suitable for photonic circuit applications. In other embodiments, the method may be used to dice through one side of a double sided die where one side of the die needs smooth edges but the other side of the die may not require such smooth edges. Illustrated in FIG. 2 is another simplified flowchart of an exemplary dicing method 200 to make a die having a smooth edge according to an embodiment that comprises the steps of: (i) masking 105 the frontside of the wafer with a masking layer; (ii) etching 110 the frontside of a wafer through the active layers of the wafer desired to have smooth edges to create an etched cavity extending through those active layers into a substrate of the die if desired; (iii) stripping 115 the masking layer; (iv) protecting 120 the etched cavity with a protective material; (v) aligning 125 the wafer to a backside patterning layer that serves as a guide for dicing; (vi) mounting 130 the wafer to a dicing tape with wafer's front side mounted on the dicing tape; (vii) dicing 135 the wafer from the backside of the wafer to at least the bottom surface of the etched cavity to accomplish the separation of the dies on the wafer; (viii) unmounting 137 the dies from the dicing tape; and (ix) cleaning 140 away the protective material from the dies.

Referring to FIG. 2, in an illustrative embodiment, the masking layer used for masking the frontside of the wafer in the step of masking 105 may be a photosensitive resist and allow for etching 110, the masking material may be chosen on the basis of it being more adaptable for photonic circuits and waveguide implementations. In other embodiments, the masking layer may be comprised of hard mask such as silicon nitride or metals, which may be patterned directly or indirectly. The process may involve insertion, deposition, growth or photolithography of hard mask material with low etch rate which may act as masking material for the etch process 110.

The step of etching 110 as described in FIG. 2 may make use of microfabrication techniques associated with chemical etching techniques. Some exemplary implementation may use silicon nitride as a hard masking layer. In other embodiments the masking layer may be chosen with due consideration given to its capability to be dissolved through the use of certain solvents to enable easy removal of such material by use of those solvents in the step of stripping 115.

Similarly, the protective material used in the step of protecting 120, to protect against any damage during dicing operation, may also be chosen with consideration of its capability to be dissolved through the use of certain solvents to enable easy removal of such protective material by use of such solvents.

It will be understood by a person with ordinary skills in the art that other embodiments may make use of other types of materials for these purposes and other use available techniques for removal of these materials used in the steps of masking 105 and protecting 120.

Referring to FIG. 2, in certain embodiments, during the step of aligning 125, the wafer may be so aligned so that the cut made by the dicing saw would intersect the etched cavity created in the step of etching 110. In come embodiments, this may be accomplished by means of alignment marks placed on the backside of the wafer with or without the use of an optional protective material to protect the wafer against any damage during dicing 135.

Referring to FIG. 2, in certain embodiments of manufacturing systems, the dicing 135 may further include mounting 130 the wafer on a dicing tape in preparation for the dicing 135 operation using a dicing saw. The step of dicing 135, in certain embodiments, may use a dicing blade on the dicing saw with a blade thickness greater than the width of the etched cavity in a direction perpendicular to the dicing blade resulting in the diced cavity created as a result of the dicing 135 step of method 200 to be larger in width than the etched cavity created as a result of the etching 110 step of method 200. This may result in an etched facet to protrude from the edge surface in a separated die, which may be ideal for coupling coupled devices. This may also allow for die separation without the need for accurate depth or lateral control for the cut and at the same time resulting in complete die separation without the dicing saw blade ever touching the edges of the layers exposed in the etched cavity.

Referring to FIG. 2, the step of cleaning 140 may include, in certain embodiments, the use of solvents to remove the protective material applied to the wafer during the step of protecting 120. It will be understood that other techniques for removal of such protective material may be used instead of chemical processes utilizing solvents. Protective material layer may also be used to prevent particles resulting from the step of dicing 135 from sticking to the etched facet surface that may otherwise cause scattering.

In certain embodiments the backside of the wafer may also be covered with a protective material to protect the wafer against damage from mounting upside down or during dicing 135.

Figure 3:
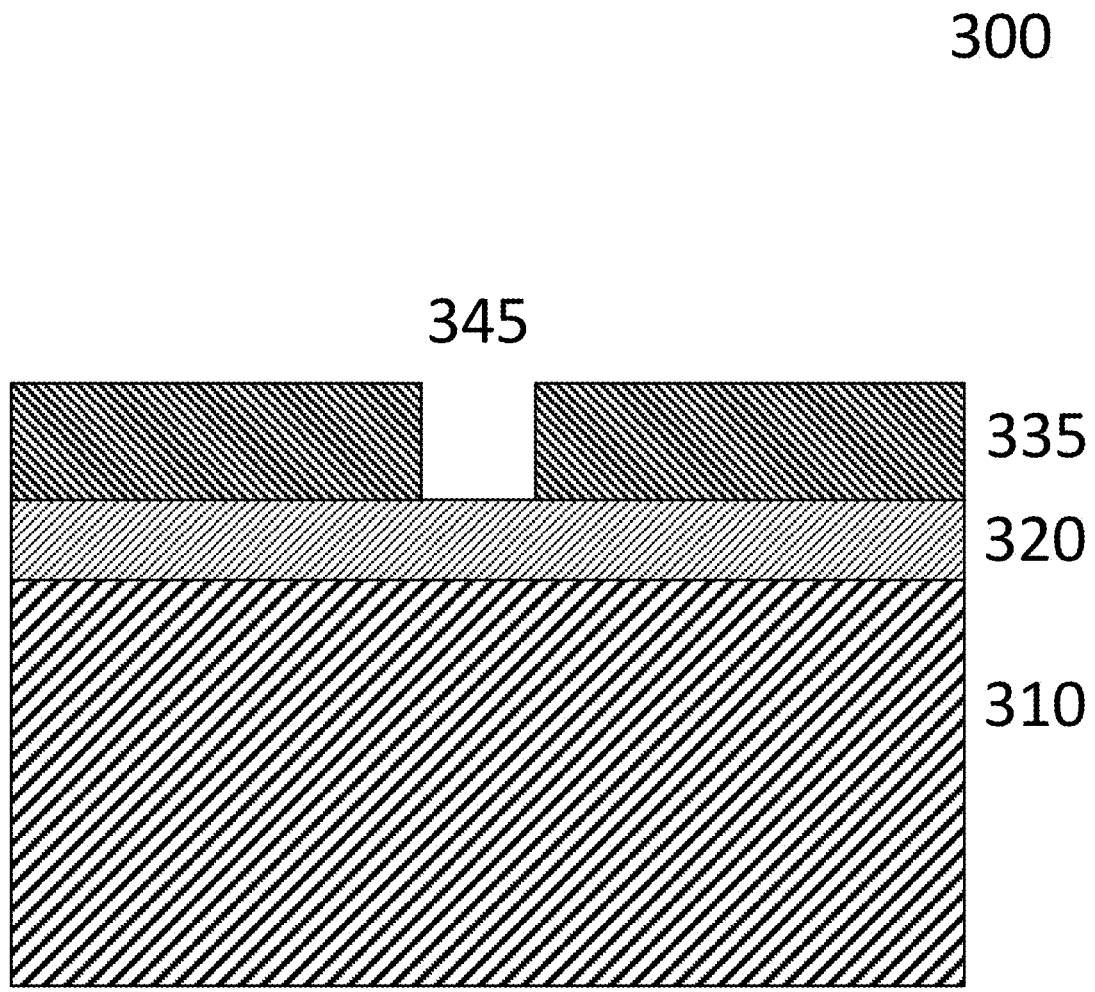
FIG. 3 is a partial cross-section view of a wafer 300 according to an embodiment, with parts in section, and parts omitted that shows various layers of the wafer.

Illustrated in FIG. 3 is a partial cross-section view of a wafer 300 according to an embodiment. In FIG. 3, the depicted wafer 300 comprises multiple layers which may include a substrate layer 310, an active layer 320 and a masking layer 335. FIG. 3 also illustrates the location where the wafer may need to be diced into separate dies in the form of a cut. In other embodiments, the cut 345 may be a pattern formed in the masking layer in preparation for etching. In certain embodiments, the masking layer 335 may be deposited on the wafer during the method step masking 105 of the method 200 as depicted in FIG. 2. In other embodiments, the pattern formed in a masking layer 335 may be limited to smaller dimensions, enabling access to limited portions of the active area and need not be continuous across the entire wafer, as would be needed for complete die separation.

Figure 4:
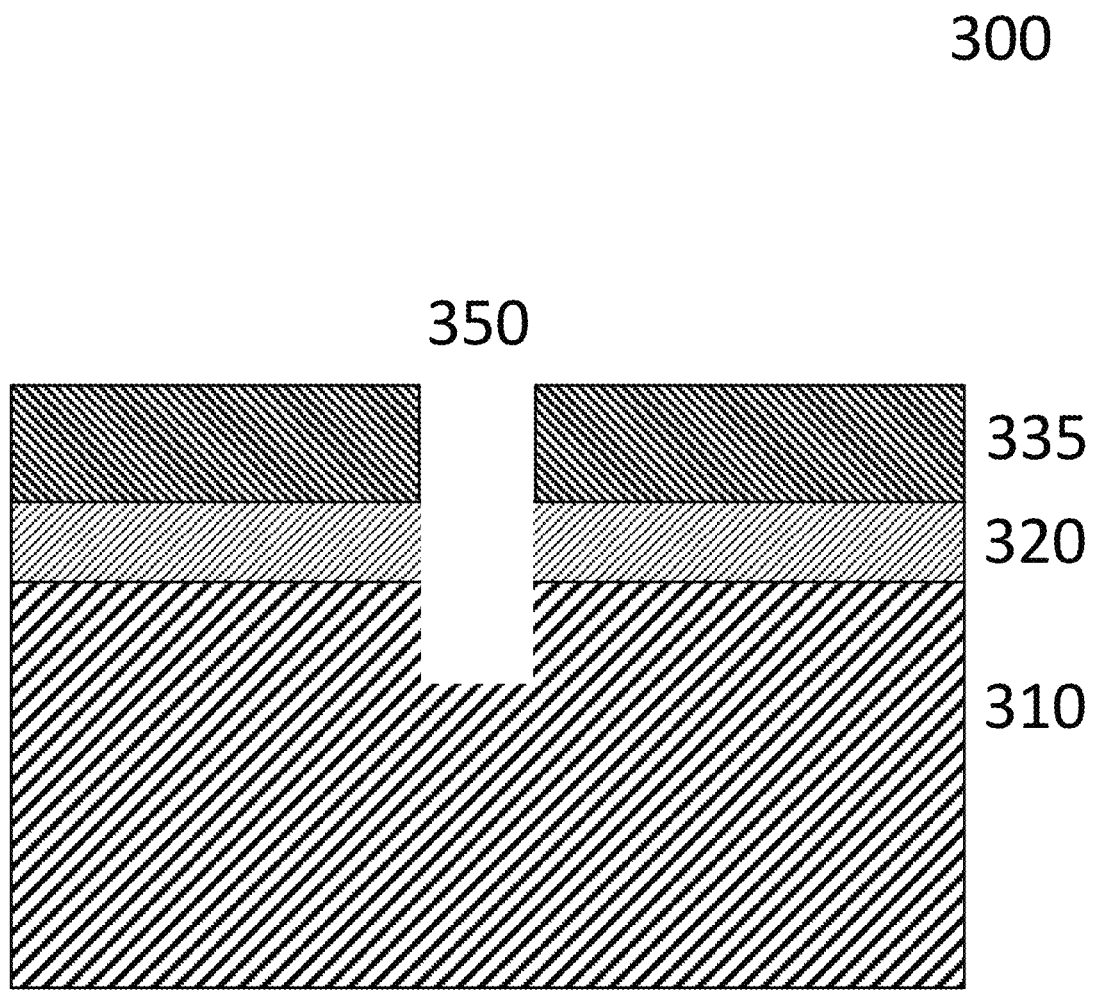
FIG. 4 is a partial cross-section view of a wafer 300 according to an embodiment, which demonstrates the partially etched cavity 350 reaching into the substrate 310.

Referring to FIG. 4, it illustrates the cross section of the wafer after the step of etching 110 in method 200 illustrated in FIG. 2, where in this particular embodiment the etching cavity 350 extends through the masking layer 335 and the active layer 320 into the substrate 310. It is to be understood that in certain embodiments there may be multiple active layers present and the etching cavity 350 may extend through all those active layers into the substrate whereas in still other embodiments, there may be multiple active layers present and the etched cavity 350 may only extend through some of those active layers and may not extend all the way through to the substrate. In certain embodiments, this cut may be created by the method step etching 110 of method 200, as illustrated in FIG. 2, through the masking layer 335 to form the etched cavity 350.

Figure 5:
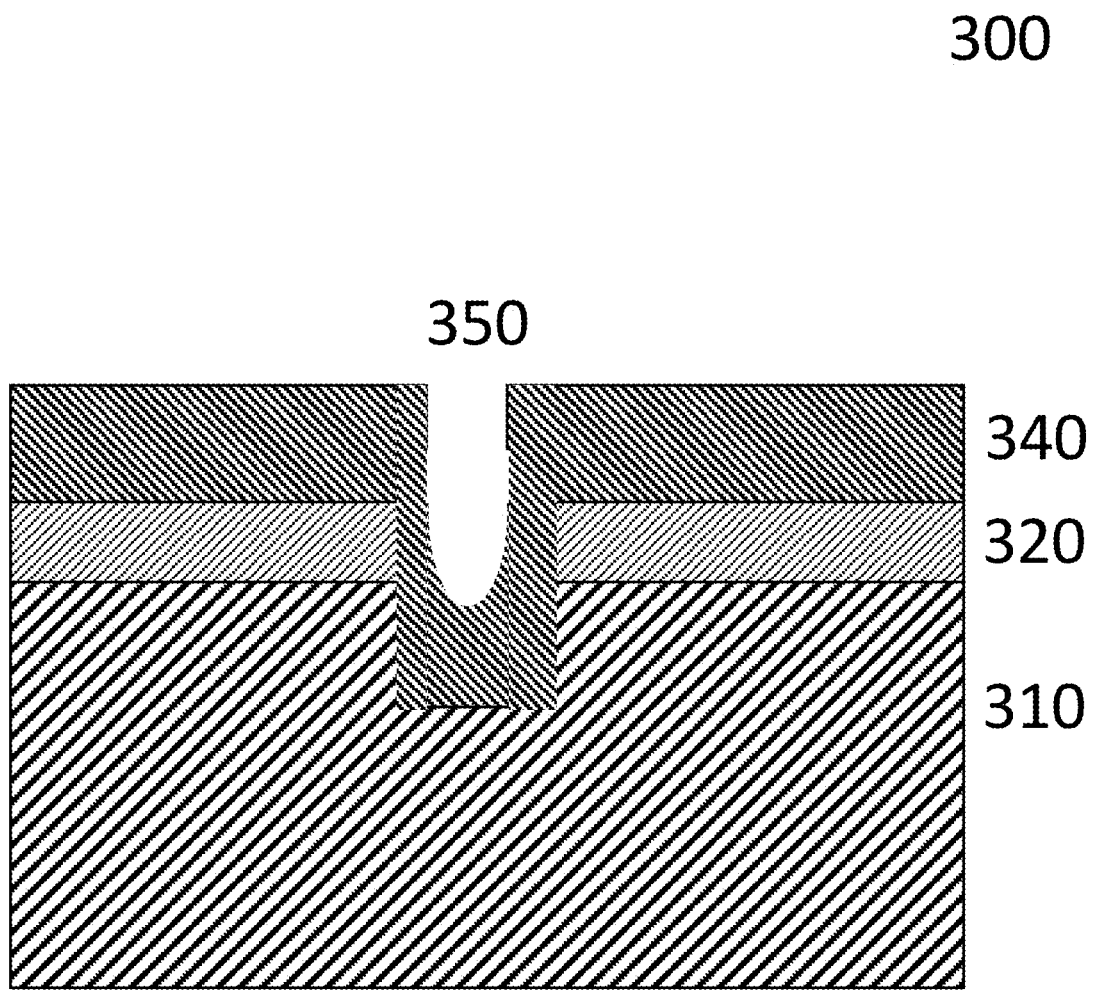
FIG. 5 is a partial cross-section view of a wafer 300 according to an embodiment, which demonstrates the etched cavity 350 with a coating of protective material 340.

Referring to FIG. 5, it illustrates the cross section of the wafer after the step of protecting 120 in method 200 illustrated in FIG. 2, where in this particular embodiment the etching cavity 350 extends through the active layer 320 into the substrate 310. FIG. 5 also depicts the protective material layer 340 created as a result of the step of protecting 120 in method 200 illustrated in FIG. 2. In certain embodiments, the protective material layer 340 may be formed by using material which may be removed by means of solvents. The use of the protective material layer may be necessitated in some embodiments of manufacturing systems in order to protect the etched cavity from damage during the additional steps of mounting 130 or dicing 135 of method 200 as depicted in FIG. 2.

Figure 6:
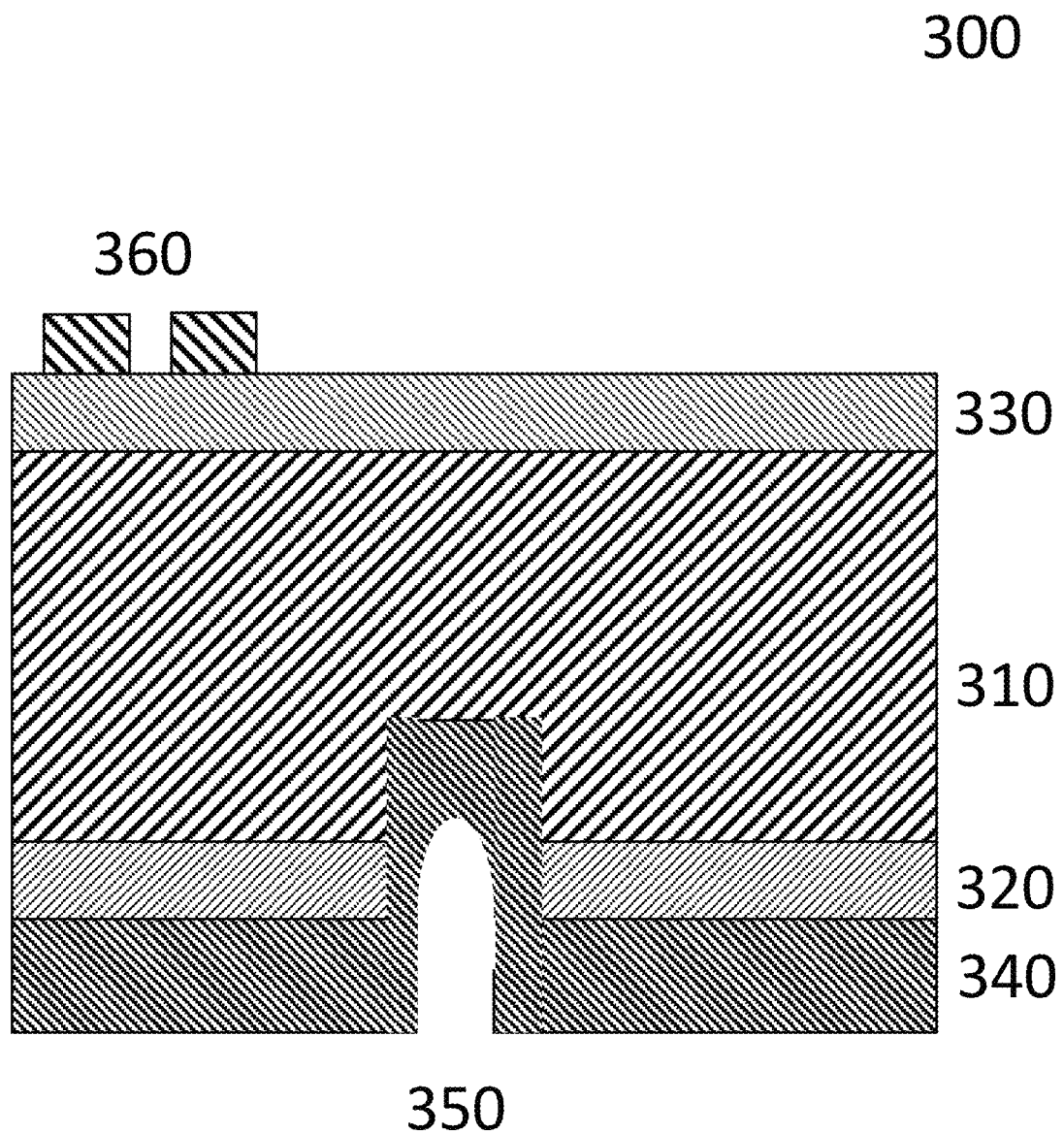
FIG. 6 is a partial cross-section view of an upside-down wafer 300 according to an embodiment, which demonstrates optional alignment notches 360.

Illustrated in FIG. 6 is a partial flipped cross-section view of a wafer 300 with its frontside at the bottom and the backside at the top of the figure according to an embodiment. FIG. 6 further illustrates the alignment marks 360 that may be used in the step of aligning 125 of method 200 illustrated in FIG. 2. In certain embodiments, the alignment marks 360 may be used in conjunction with an optional protective material 330 as illustrated, whereas in other embodiments they may be directly on the backside of the wafer. These alignment marks 360 may be used in certain embodiments to ensure the dicing blade would intersect the etched cavity 350 during the step of dicing 135 of method 200 as illustrated in FIG. 2. It would be understood that such alignment may be accomplished without the use of alignment mark(s), such as by means of infrared camera mounted on dicing saw to automatically align to the etched cavity on the frontside of the wafer.

Figure 7:
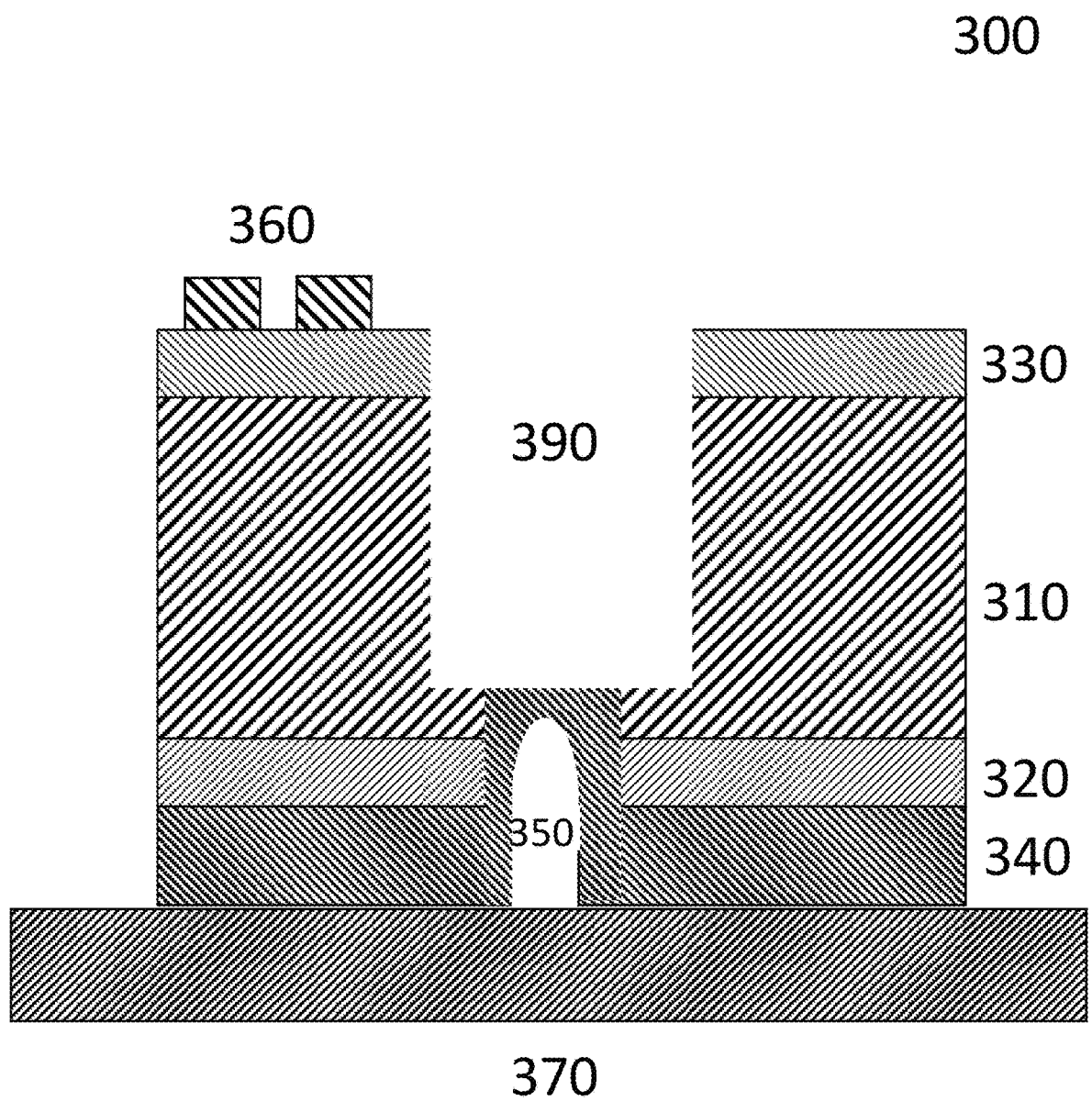
FIG. 7 is a partial cross-section view of a wafer 300 according to an embodiment, which demonstrates the die mounted on a Dicing tape 370 along with a diced cavity 390.

Referring to FIG. 7, the depicted wafer 300 is illustrated after the step of dicing 135 of method 200. The wafer is portrayed as being mounted on a dicing tape 370 as a result of the step of mounting 135 of method 200. The wafer also shows a dicing cavity 390, formed as a result of the step of dicing 135 of method 200, extending from the backside of the wafer into the substrate 310 and intersecting the etched cavity 350 that is depicted as partially filled with the protective material 340 deposited as a result of the step of protecting 120 of method 200. It is understood that the width and depth of the dicing cavity 390 may vary in various embodiments as well as the number of active layers on the wafer may vary. In other embodiments the intersection point of the dicing cavity and the etched cavity may be in an active layer instead of the substrate layer. In yet other embodiments, the dicing cavity and etched cavity may not intersect if the embodiment does not require complete separation of die but rather generation of a smooth edged cavity in the die.

Figure 8:
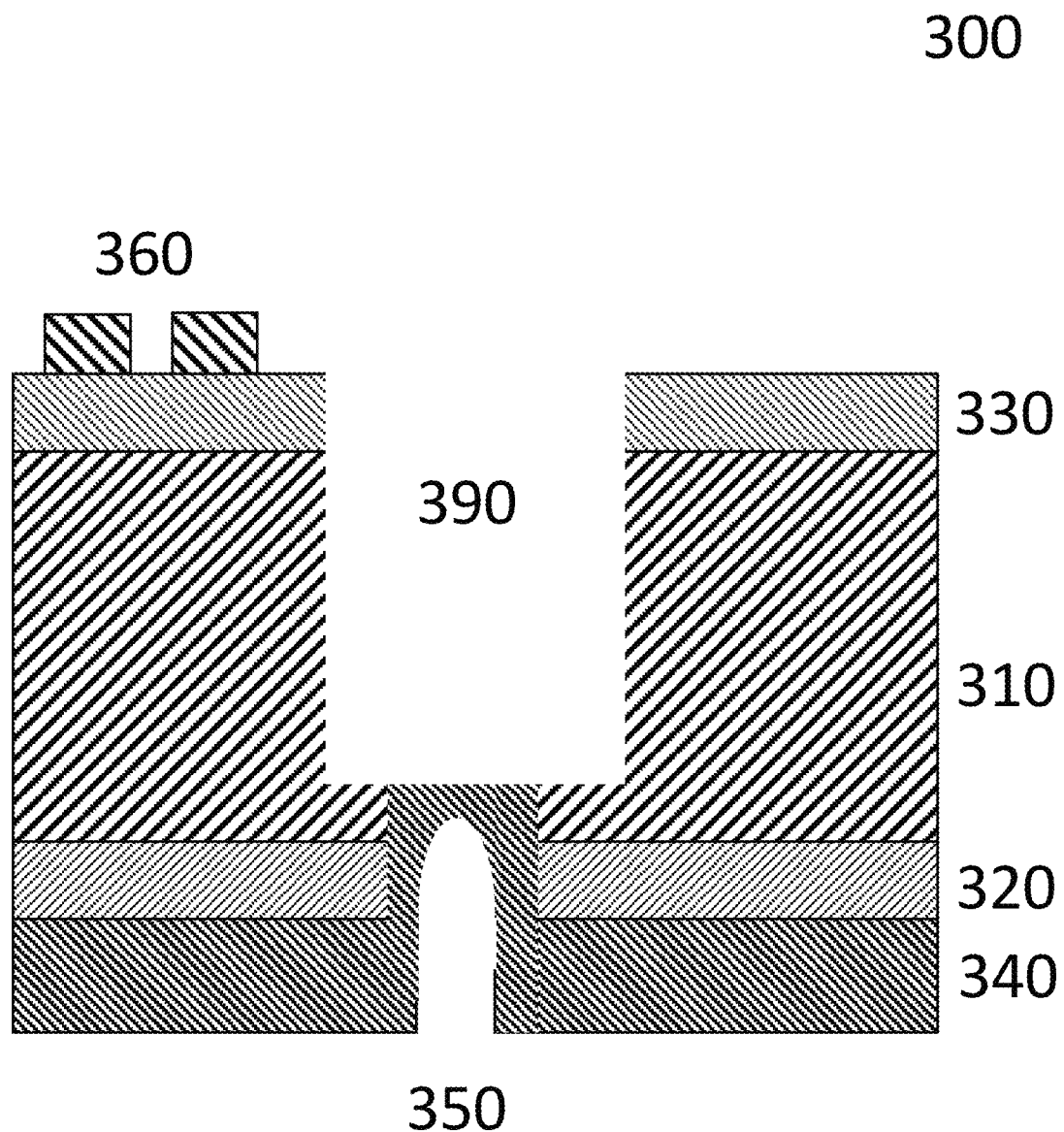
FIG. 8 is a partial cross-section view of a wafer 300 according to an embodiment, which demonstrates the diced cavity 390.

FIG. 8 illustrates the wafer 300 after the step of unmounting 137 of method 200 where the wafer is portrayed with the frontside of the wafer at the bottom and the backside of the wafer on the top of the figure with the dicing cavity 390 extending from the backside of the wafer to intersect the etched cavity 350 in the substrate 310.

Figure 9:
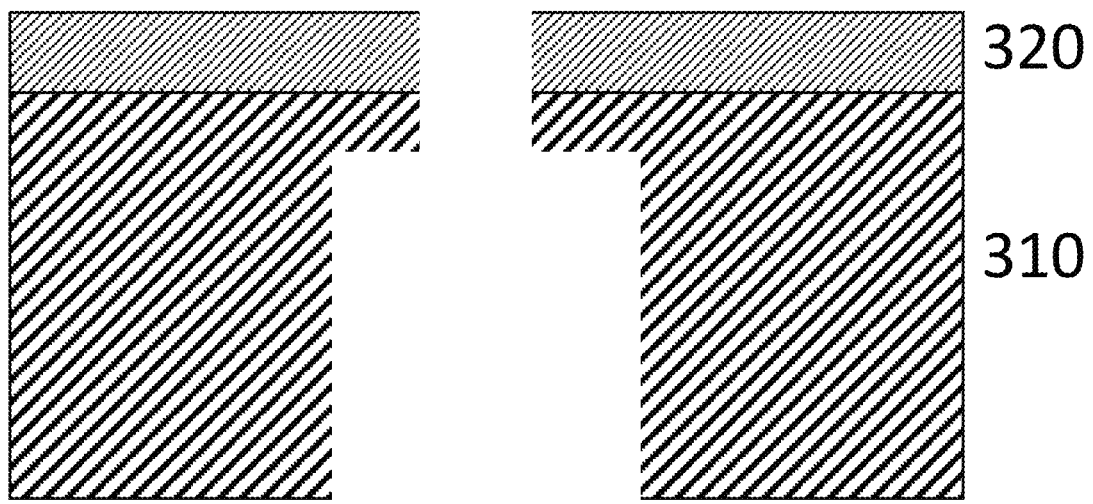
FIG. 9 is a partial cross-section view of a wafer 300 according to an embodiment, which demonstrates the resulting smooth edged adjacent dies.

Finally, FIG. 9 shows the cross section view of two adjacent dies separated on the wafer as a result of executing all the steps of method 200 including the step of cleaning 140, in which the protective material on the frontside of the wafer has been removed. The edges of the active layers are a result of the etching process and are not impacted by the dicing saw as the dicing cavity stops short of the active layer.

It is to be understood that other embodiments may be utilized, such as methods where the backside of the wafer may also be coated with a protective material coating.

Apparatus, methods and systems according to embodiments of the disclosure are described. Although specific embodiments are illustrated and described herein, it will be appreciated by those of ordinary skill in the art that any arrangement which is calculated to achieve the same purposes may be substituted for the specific embodiments shown. This application is intended to cover any adaptations or variations of the embodiments and disclosure. For example, although described in terminology and terms common to the field of art, exemplary embodiments, systems, methods and apparatus described herein, one of ordinary skill in the art will appreciate that implementations may be made for other fields of art, systems, apparatus or methods that provide the required functions. The invention should therefore not be limited by the above described embodiment, method, and examples, but by all embodiments and methods within the scope and spirit of the invention.

In particular, one of ordinary skill in the art will readily appreciate that the names of the methods and apparatus are not intended to limit embodiments or the disclosure. Furthermore, additional methods, steps, and apparatus can be added to the components, functions can be rearranged among the components, and new components to correspond to future enhancements and physical devices used in embodiments can be introduced without departing from the scope of embodiments and the disclosure. One of skill in the art will readily recognize that embodiments are applicable to future systems, future apparatus, future methods, and different materials.

All methods described herein can be performed in a suitable order unless otherwise indicated herein or otherwise clearly contradicted by context. The use of any and all examples, or exemplary language (e.g., "such as"), is intended merely to better illustrate the disclosure and does not pose a limitation on the scope of the disclosure unless otherwise claimed. No language in the specification should be construed as indicating any non-claimed element as essential to the practice of the disclosure as used herein.

Terminology used in the present disclosure is intended to include all environments and alternate technologies that provide the same functionality described herein.

We claim:

1. A method of making a die having a smooth edge for edge-coupling to an optical waveguide, said method comprising the steps of:
    etching a front side of a wafer through an active layer of the wafer to create an etched cavity defining the smooth edge and extending through the active layer and at least partially into a substrate layer of the wafer on which the active layer is formed;
    disposing a layer of protective material over at least the smooth edge within the etched cavity;
    dicing the wafer from a backside of the wafer through the substrate layer opposite the etched cavity to at least a bottom surface of the protective material to produce a diced cavity; and
    removing the protective layer to expose the smooth edge.

2. The method of claim 1, wherein the step of dicing further comprises using a dicing blade having a blade thickness greater than a width of the etched cavity perpendicular to the dicing blade.

3. The method of claim 1, further comprising the step of aligning the dicing blade on the backside of the wafer to intersect the etched cavity.

4. The method of claim 1, further comprising mounting the wafer's frontside to a dicing tape prior to the step of dicing.

5. The method of claim 1, further comprising the step of creating at least one alignment mark on the backside of the wafer.

6. The method of claim 1, further comprising the step of:
    masking the front side of the wafer with a masking layer prior to the step of etching; and
    stripping the masking layer prior to the step of dicing.

7. The method of claim 6 further comprising the step of:
    protecting the etched cavity with a protective material after the step of stripping said masking layer; and
    cleaning away said protective material after the step of dicing.

8. The method of claim 7, further comprising stripping the protective material from the said etched cavity with a solvent.

9. The method of claim 6, further comprising the masking layer being photosensitive.

10. The method of claim 6, further comprising the masking layer comprising a hard mask material patterned directly or indirectly.

11. The method of claim 6, further comprising stripping the masking layer with a solvent.

12. A manufacturing system to make a die with at least one smooth edge that uses the method of claim 6.

13. A manufacturing system to make a die with at least one smooth etched cavity that uses the method of claim 6.

14. A die with at least one smooth edge made by a method of making a die, said method comprising the method of claim 6.

15. A die with at least one smooth etched cavity made be a method of making a die, said method comprising the method of claim 6.

16. A manufacturing system to make a die with at least one smooth edge that uses the method of claim 1.

17. A manufacturing system to make a die with at least one smooth etched cavity that uses the method of claim 1.

18. A die with at least one smooth edge made by a method of making a die, said method comprising the method of claim 1.

19. A die with at least one smooth etched cavity made by a method of making a die, said method comprising the method of claim 1.

20. A method of making a die having a smooth edge for edge-coupling to an optical waveguide, said method comprising the steps of:
    masking the front side of the wafer with a masking layer;
    etching a front side of a wafer through an active layer of the wafer to create an etched cavity defining the smooth edge and extending through at least a portion of the active layer;
    stripping the masking layer;
    disposing a protective material over the etched cavity thereby protecting the etched cavity with the protective material;
    dicing the wafer from a backside of the wafer opposite the etched cavity to at least a bottom surface of cavity protective material to produce a diced cavity that retains the smooth edge; and removing the protective material.

\* \* \* \* \*

UNITED STATES PATENT AND TRADEMARK OFFICE
CERTIFICATE OF CORRECTION

| | |
|---|---|
| PATENT NO. | : 11,150,409 B2 |
| APPLICATION NO. | : 16/406541 |
| DATED | : October 19, 2021 |
| INVENTOR(S) | : Brian Mattis et al. |

It is certified that error appears in the above-identified patent and that said Letters Patent is hereby corrected as shown below:

In the Claims

Column 8, Line 67; Claim 20:
"etched cavity to at least a bottom surface of cavity" should read
--etched cavity to at least a bottom surface of the--

Signed and Sealed this
Eleventh Day of January, 2022

Drew Hirshfeld
*Performing the Functions and Duties of the*
*Under Secretary of Commerce for Intellectual Property and*
*Director of the United States Patent and Trademark Office*